United States Patent
Turner

(10) Patent No.: US 8,778,209 B2
(45) Date of Patent: Jul. 15, 2014

(54) APPARATUS AND METHOD FOR INCREASING SURFACE AREA OF PIPES

(71) Applicant: Benjamin P. L. Turner, Smyrna, GA (US)

(72) Inventor: Benjamin P. L. Turner, Smyrna, GA (US)

(73) Assignee: Linde Engineering North America Inc., Blue Bell, PA (US)

( * ) Notice: Subject to any disclaimer, the term of this patent is extended or adjusted under 35 U.S.C. 154(b) by 0 days.

(21) Appl. No.: 13/709,149

(22) Filed: Dec. 10, 2012

(65) Prior Publication Data

US 2014/0158661 A1 Jun. 12, 2014

(51) Int. Cl.
 *C03C 15/00* (2006.01)
 *C03C 25/68* (2006.01)
 *B29D 23/00* (2006.01)

(52) U.S. Cl.
 CPC .................................. *B29D 23/001* (2013.01)
 USPC ................... 216/83; 216/90; 216/91; 216/96; 216/102; 216/103

(58) Field of Classification Search
 None
 See application file for complete search history.

(56) References Cited

U.S. PATENT DOCUMENTS

| | | | | |
|---|---|---|---|---|
| 3,048,512 | A | * | 8/1962 | Nelson ............................. 216/9 |
| 4,287,827 | A | * | 9/1981 | Warner ........................ 101/141 |
| 2010/0159138 | A1 | * | 6/2010 | Kim et al. ..................... 427/256 |

* cited by examiner

*Primary Examiner* — Duy Deo
(74) *Attorney, Agent, or Firm* — Joshua L. Cohen

(57) ABSTRACT

An apparatus for altering a surface of a cylindrical object includes at least one container containing a fluid resist therein and having at least one opening from which the fluid resist is discharged; at least one roller operatively associated with the at least one container and having a surface sized and shaped to be exposed to the at least one opening, the surface area including a pattern of shapes and upon which the fluid resist is deposited; and at least one support member adjacent the at least one roller for supporting the cylindrical object during transit for contacting the at least one roller. A method is also provided.

12 Claims, 3 Drawing Sheets

APPARATUS AND METHOD FOR INCREASING SURFACE AREA OF PIPES

BACKGROUND

The present embodiments relate to altering the surface area of cylindrical objects, such as for example pipes and tubes, for increasing heat transfer at same.

It is desirable to increase a surface area of pipes and tubes (collectively "piping") in order to increase their heat transfer efficiency. Such pipes are used in, for example, heat exchangers and condensers. Known methods include chemical or mechanical joining of fins or wings to existing piping to increase the surface area of said piping to bring about heat transfer efficiency. However, these known processes are labor intensive, which results in increased cost, and are limited in the temperature and the fabrication of the surface area of the piping. For example, the fins which are welded or joined to the piping are usually limited to a lower temperature and are expensive to fabricate due to the exacting tolerances required of the fins.

In addition, certain alloys cannot be used to fabricate the fins because of the metallurgical or other physical differences between the fins and the base metal used for the existing piping. The physical or molecular differences between the material of the fins and the base metal of the piping may sometimes result in incompatibility of these elements such that the structural integrity of the piping is compromised due to the weakened joint between the components.

It is also common for fins only to be available in certain repetitive shapes that disallow for novel, particular patterns that could be used to further enhance turbulent or other fluid effects during the heat transfer. While mechanical machining allows almost all types of metals to be machined for the piping, the cost to do so for a myriad of different types of pipes can be unusually expensive, and therefore the related cost for the area to have an increased ratio of surface heat transfer effect by direct machining of said surface is generally prohibitive.

It would therefore be desirable to have an apparatus and method for use with all types of metallic piping to increase the heat transfer effect at a surface of said piping with minimal labor and material costs.

BRIEF DESCRIPTION OF THE DRAWINGS

For a more complete understanding of the present embodiments, reference may be had to the following description taken in conjunction with the drawing Figures, of which.

DETAILED DESCRIPTION OF THE INVENTION

Figure 1:
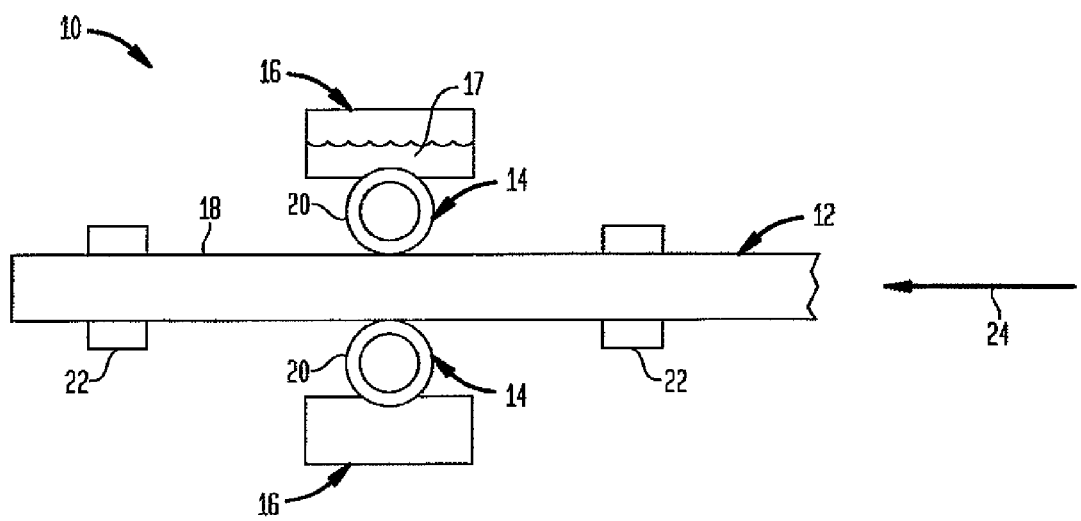
FIG. 1 shows a side view in cross-section of an embodiment of a surface relief apparatus of the present invention.

Referring to FIG. 1, an embodiment of a surface relief apparatus of the present invention is shown generally at 10. The apparatus 10 is used to deposit "resist" on a surface area of cylindrical tubing 12, such as for example pipes, conduits and other objects of similar construction.

The apparatus 10 includes at least one printing wheel 14 or alternatively, as shown in FIG. 1, a pair or a plurality of the printing wheels for coacting with the pipe 12. If a pair of the printing wheels 14 are used, such pair will be spaced apart a distance sufficient to receive the pipe 12 therebetween for deposition of the resist as describe hereinafter.

Disposed adjacent to and for coaction with the printing wheel 14, roller or drum is a reservoir 16 in which is contained a fluid resist 17 for being deposited on a surface 18 of the pipe 12. Again, it is possible to use one of the reservoirs 16 for a corresponding one of the printing wheels 14 used in the apparatus 10, as shown for example in FIG. 1. Each one of the printing wheels 14 has a surface area 20 which is in fluid communication with the reservoir 16 for receipt of the liquid resist on to the surface 20 of the printing wheel. It is possible that either the reservoir 16 or the wheel surface 20 will have the particular pattern that is to be assumed by the resist and transferred onto the surface 18 of the pipe. As the printing wheel 14 rotates, the surface 20 of the wheel is coated with the fluid resist 17 from the reservoir 16 such that the resist is thereafter deposited as a specific pattern on the piping surface 18.

At least one bearing 22 or support member is used to support the pipe 12 for introduction adjacent to or between the printing wheels 14 so that deposition of the resist 17 on the surface 18 of the pipe is sufficient and uniform according to the desired application pattern. The bearing 22 or bearings can be roller bearings.

A direction of travel of the pipe 12 with respect to the apparatus 10 is shown generally by arrow 24.

Figure 2:
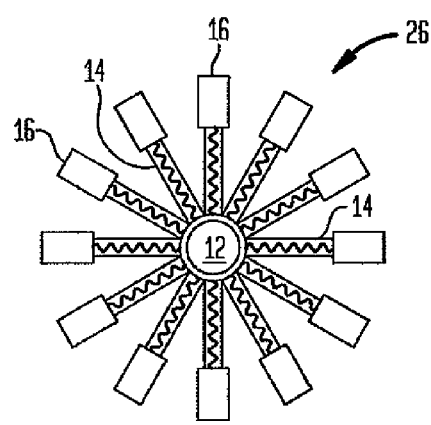
FIG. 2 shows an end view in cross-section of another embodiment of a surface relief apparatus.

Referring also to FIG. 2, another embodiment of the surface relief apparatus is shown generally at 26. In this apparatus 26, a plurality of the printing wheels 14 are used such that the entire surface 18 of the pipe 12 is covered in the select pattern of the resist 17 to be deposited. Each one of the printing wheels 14 may have its own corresponding reservoir 16 of the fluid resist 17. Alternatively, each one of the printing wheels 14 is in fluid communication with a common reservoir which functions as a manifold or plenum to supply the fluid resist 17 to each one of the plurality of printing wheels.

Figure 3A:
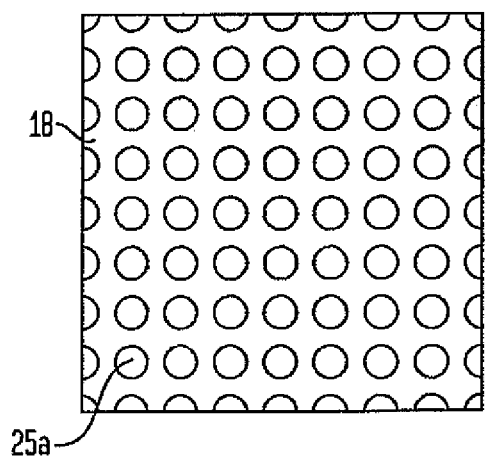
FIGS. 3A-3C show portions of top plan views of different surface relief provided by the apparatus of FIGS. 1 and 2.
Figure 3B:
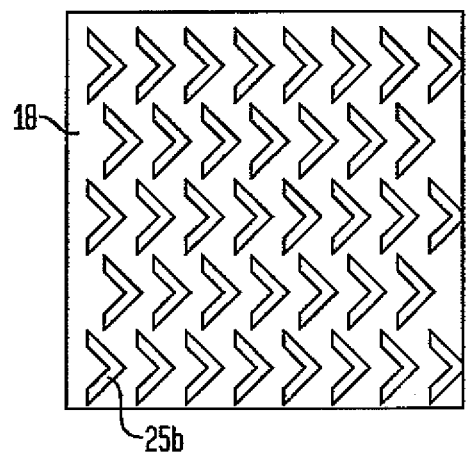
Figure 3C:
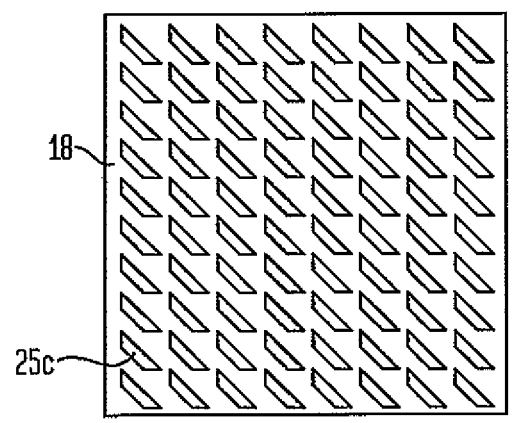

FIGS. 3A-3C show the different patterns or shapes of resist that can be deposited on the surface 18 of the pipe 12, as for example "microbumps". A pattern of resist bumps 25a shown in FIG. 3A, chevrons 25b shown in FIG. 3B or diagonals 25c shown in FIG. 3C, can be deposited on the pipe surface 18. Alternatively, any number of these shapes 25a-c or a combination of same in a corresponding pattern can be used for deposition on the pipe surface 18. That is, the patterns shown in FIGS. 3A-3C are formed in relief on the surface 20 of each printing wheel 14 so that the fluid resist 17 is deposited on the elevated pattern for subsequent deposition on the cylindrical tubing 12. The microbumps may extend, by way of example only, approximately 1 mm above the pipe surface 18. FIGS. 3A-3C also show for example an area of 1.60, 1.76 and 2.83 square inches, respectively, of the pipe surface 18 having the bump pattern.

Figure 4:
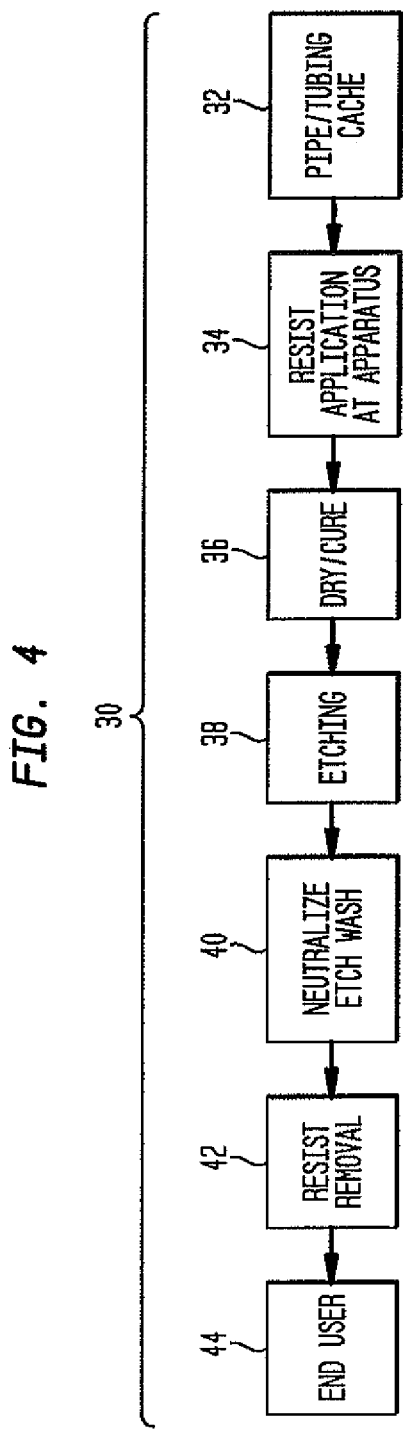
FIG. 4 shows an embodiment of a method which may be used to provide surface relief to cylindrical objects such as piping.
Figure 1:
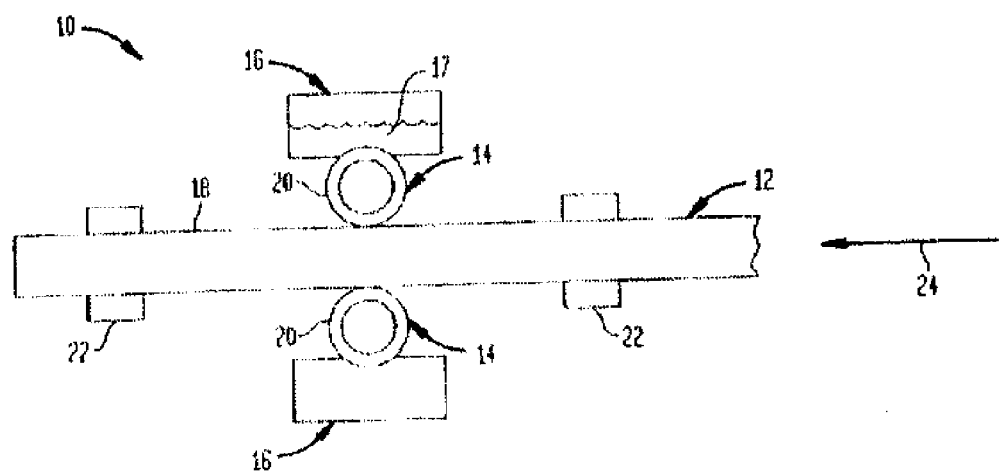
Figure 2:
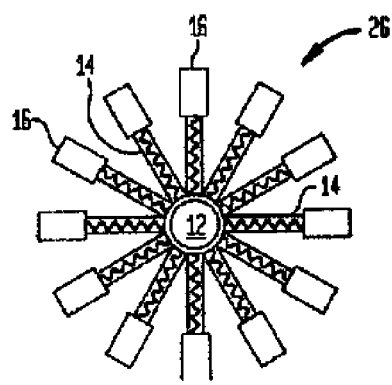

In FIG. 4, a method is shown generally at 30 for having the pipe 12 etched with surface relief of the patterns from, for example, FIGS. 3A-3C or any other pattern desired, to provide increased surface area and therefore increased heat transfer effect at the pipe surface 18.

In operation of the method, a particular type of the pipe 12 is selected 32 for etching. A pipe or tubing cache can be staged in any manner. Thereafter, each one of the pipes 12 are provided to the surface relief apparatus 10 in the step 34 for deposition of the fluid resist 17 in a select pattern on the surface 18 of the pipe. The pattern selected may be that shown in FIGS. 3A-3C, for example. When the pipe 12 emerges from the apparatus 10, the pipe is subjected to a drying step 36 for drying and stabilizing the resist 17. Alternatively, if the fluid resist 17 is an epoxy, such may be cured with ultraviolet (UV) or visible light. Thereafter, the pipe 12 is subjected to an etching step 38 which will remove a select amount of the surface 18 of the pipe 12 that is not protected by the fluid resist 17 pattern. After the etching step 38, the pipe 12 is subjected to a wash 40 for removing or neutralizing the particular etching substance used in the step 38. The washing can be done with water or deionized water, for example. If an acid etchant is used for the etching 38, more than likely a neutralizing agent for the acid will have to be used to neutralize any remaining acid on the surface 18 of the pipe 12. After neutralizing, the pipe surface 18 may also be washed. After the neutralizing and/or washing step 40, the resist 17 must be removed and this can be done in a removal step 42 which may include heat lamps or other heating elements to burn off and/or dissolve the resist 17. It is also possible to remove the resist with a chemical treatment to dissolve the resist from the pipe 12. The result will be that the surface area 18 of the pipe 12 has been etched or worn away except for the particular pattern of microbumps which remain due to the resist 17 deposited during the resist deposition step 34. Thereafter, the pipe 12 having a new surface relief with a select pattern of, for example, the shapes of FIGS. 3A-3C, and corresponding heat transfer effect will be provided for subsequent processing, such as cutting, bending, painting, graphics, mechanical attachments, etc., or for immediate use by an end user 44.

The surface relief apparatus 10,26 could alternatively employ either electrostatic, laser or ion deposition of the fluid resist 17. Photolithography is also possible for deposition of the fluid resist 17 for the step 34.

The fluid resist 17 used may be a resin epoxy which would resist a particular etchant chosen. Depending upon the chemistry used in the etchant or wash step 40, this would determine the type of fluid resist 17 used. For example, during electrolytic etching, a basic inorganic fluid resist 17 may be sufficient. However, if acid etching is used for the etching step 38, a resin epoxy as the fluid resist 17 could be used at the surface 18 of the pipe 12. An adhesive polymer may also be used for the resist 17.

Similarly, the etchant solution for the step 38 would also be dependant upon the material type of the pipe 12. For example, if the pipe 12 is high in nickel content, this would require a fluorinated compound (hydrofluoric) etchant, while a sodium hydroxide would be sufficient for etching a stainless steel pipe. A carbon steel or chromium-molybdenum steel could be etched with an electrolytic process containing sodium chloride.

Regarding the patterns of FIGS. 3A-3C, such as presented are examples only and are not meant to be limiting. It is submitted that a cost-benefit analysis may be performed of the etching solution cost versus the metal of the pipe 12 to be etched. In other words, if the pipe 12 is constructed from a particular material, certain of the patterns for FIGS. 3A-3C would be desirable depending upon convection and radiation requirements of the pipe.

It will be understood that the embodiments described herein are merely exemplary, and that one skilled in the art may make variations and modifications without departing from the spirit and scope of the invention. All such variations and modifications are intended to be included within the scope of the invention as described and claimed herein. Further, all embodiments disclosed are not necessarily in the alternative, as various embodiments of the invention may be combined to provide the desired result.

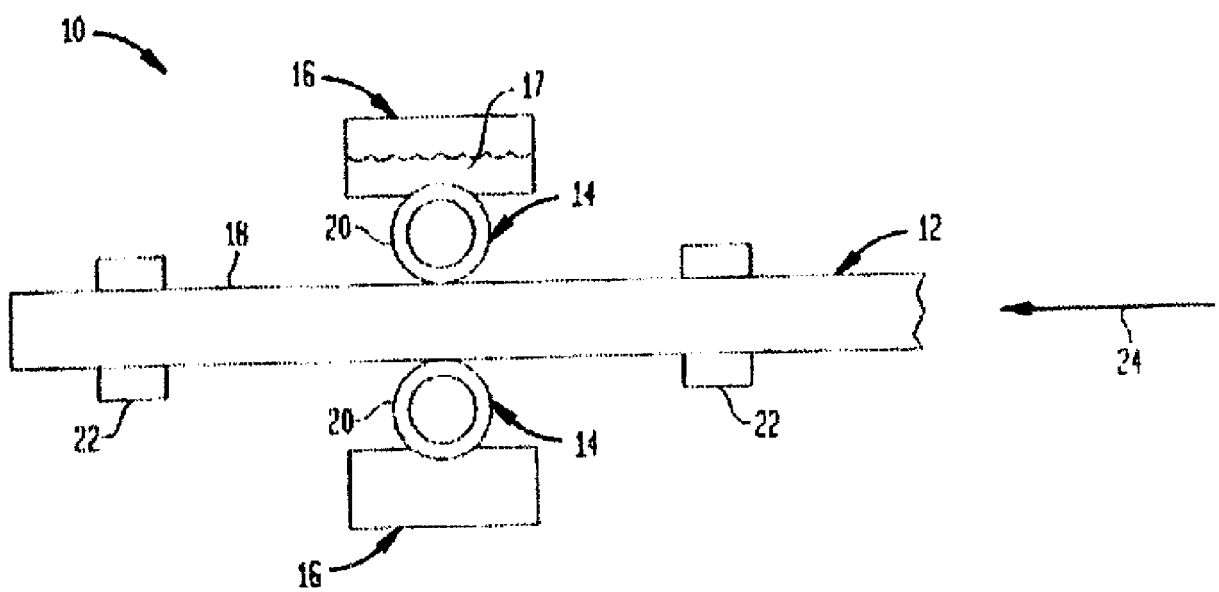

What is claimed is:

1. A method for altering a surface of a cylindrical object, comprising:

providing at least one container containing a fluid resist therein;

discharging the fluid resist in a pattern onto a surface of a roller;

moving the roller for transferring the fluid resist in the pattern onto the surface area of the cylindrical object;

solidifying the fluid resist in the pattern;

etching the surface with an etchant; and removing the fluid resist for providing the surface in relief with the select pattern.

2. The method of claim 1, wherein the moving the roller comprises rotating the roller.

3. The method of claim 1, wherein the solidifying comprises steps selected from the group consisting of drying the fluid resist, and curing the fluid resist.

4. The method of claim 3, wherein the drying comprises exposing the fluid resist to a heating apparatus.

5. The method of claim 3, wherein the curing comprises exposing the fluid resist to light selected from the group consisting of ultraviolet (UV) light, and ambient light.

6. The method of claim 1, wherein the etching comprises exposing the cylindrical object to a bath selected from the group consisting of an acid bath of the etchant, an alkaline bath, and a salt solution bath to which an electrical current is supplied.

7. The method of claim 6, further comprising washing the etchant from the surface after the etching.

8. The method of claim 7, wherein the washing comprises subjecting the cylindrical object to a liquid selected from the group consisting of water and de-ionized water.

9. The method of claim 6, further comprising neutralizing the etchant at the surface area after the etching.

10. The method of claim 9, further comprising washing the etchant from the surface after the neutralizing.

11. The method of claim 1, wherein the fluid resist is selected from the group consisting of resin epoxy, inorganic fluid resist, and adhesive polymer.

12. The method of claim 1, wherein the cylindrical object is selected from the group consisting of a metallic pipe, and a metallic tube.

* * * * *

UNITED STATES PATENT AND TRADEMARK OFFICE
CERTIFICATE OF CORRECTION

| | | |
|---|---|---|
| PATENT NO. | : 8,778,209 B2 | Page 1 of 3 |
| APPLICATION NO. | : 13/709149 | |
| DATED | : July 15, 2014 | |
| INVENTOR(S) | : Turner | |

It is certified that error appears in the above-identified patent and that said Letters Patent is hereby corrected as shown below:

Title page, illustrative fig. 2 should be deleted and substitute therefore the attached title page consisting of illustrative fig. 1.

In the Drawings

The drawing sheet 1 of 3 consisting of Fig(s) 1-2 should be deleted and substitute therefore the attached drawing sheet 1 of 3 consisting of Fig(s) 1-2.

Signed and Sealed this
Seventeenth Day of February, 2015

Michelle K. Lee
*Deputy Director of the United States Patent and Trademark Office*

(12) United States Patent
Turner

(10) Patent No.: US 8,778,209 B2
(45) Date of Patent: Jul. 15, 2014

(54) APPARATUS AND METHOD FOR INCREASING SURFACE AREA OF PIPES

(71) Applicant: Benjamin P. L. Turner, Smyrna, GA (US)

(72) Inventor: Benjamin P. L. Turner, Smyrna, GA (US)

(73) Assignee: Linde Engineering North America Inc., Blue Bell, PA (US)

(*) Notice: Subject to any disclaimer, the term of this patent is extended or adjusted under 35 U.S.C. 154(b) by 0 days.

(21) Appl. No.: 13/709,149

(22) Filed: Dec. 10, 2012

(65) Prior Publication Data
US 2014/0158661 A1   Jun. 12, 2014

(51) Int. Cl.
C03C 15/00   (2006.01)
C03C 25/68   (2006.01)
B29D 23/00   (2006.01)

(52) U.S. Cl.
CPC .................. B29D 23/001 (2013.01)
USPC ........... 216/83; 216/90; 216/91; 216/96; 216/102; 216/103

(58) Field of Classification Search
None
See application file for complete search history.

(56) References Cited

U.S. PATENT DOCUMENTS

| 3,048,512 A * | 8/1962 | Nelson | 216/9 |
| 4,287,827 A * | 9/1981 | Warner | 101/141 |
| 2010/0150138 A1* | 6/2010 | Kim et al. | 427/256 |

* cited by examiner

*Primary Examiner* — Duy Deo
(74) *Attorney, Agent, or Firm* — Joshua L. Cohen

(57) ABSTRACT

An apparatus for altering a surface of a cylindrical object includes at least one container containing a fluid resist therein and having at least one opening from which the fluid resist is discharged, at least one roller operatively associated with the at least one container and having a surface sized and shaped to be exposed to the at least one opening, the surface area including a pattern of shapes and upon which the fluid resist is deposited, and at least one support member adjacent the at least one roller for supporting the cylindrical object during transit for contacting the at least one roller. A method is also provided.

12 Claims, 3 Drawing Sheets